United States Patent [19]

Uchida

[11] 4,287,574
[45] Sep. 1, 1981

[54] MEMORY CELL WITH NON-VOLATILE MEMORY ELEMENTS

[75] Inventor: Yukimasa Uchida, Yokohama, Japan

[73] Assignee: Tokyo Shibaura Denki Kabushiki Kaisha, Kawasaki, Japan

[21] Appl. No.: 70,394

[22] Filed: Aug. 28, 1979

[30] Foreign Application Priority Data

Sep. 20, 1978 [JP] Japan .................................. 53-114577

[51] Int. Cl.³ .............................................. G11C 11/40
[52] U.S. Cl. ...................................... 365/156; 365/184
[58] Field of Search ................. 365/154, 156, 184, 185

[56] References Cited

U.S. PATENT DOCUMENTS

| 4,091,460 | 5/1978 | Schuermeyer et al. | 365/154 |
|---|---|---|---|
| 4,103,185 | 7/1978 | Denes | 365/156 |
| 4,132,904 | 1/1979 | Harari | 365/154 |

Primary Examiner—Stuart N. Hecker

Attorney, Agent, or Firm—Oblon, Fisher, Spivak, McClelland & Maier

[57] ABSTRACT

A non-volatile memory cell has a pair of inverter circuits. In each inverter circuit, first and second insulated gate transistors of the first channel type and a third insulated gate transistor of the second channel type are serially connected in this order. The gates of the first transistor and the third transistor are commonly connected each other thereby to form an input terminal. A control terminal is formed at the gate of the second transistor. An output terminal is formed at either the source or the drain of the second transistor. The input terminal of one of the inverter is connected to the output terminal of the other inverter, while the output terminal of the former, to the input terminal of the latter. The control terminal is connected to a common control terminal. In this way, a complementary bistable circuit is formed. Non-volatile memory elements are connected to the connection points between the first and second transistors, respectively.

26 Claims, 8 Drawing Figures

MEMORY CELL WITH NON-VOLATILE MEMORY ELEMENTS

BACKGROUND OF THE INVENTION

1. Field of the Invention

The invention relates to a memory circuit and, more particularly, a non-volatile static semiconductor memory circuit.

2. Description of the Prior Art

Figure 1:
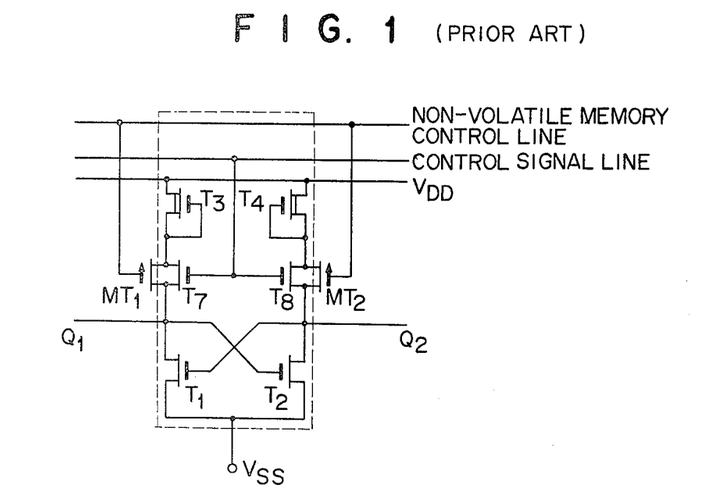
FIG. 1 shows a circuit diagram of a conventional non-volatile memory cell.

A non-volatile read-write random access memory as one of the conventional non-volatile semiconductor memory circuits is discussed in a paper "A 256 Bit Non-volatile Static Random Access Memory with MNOS Memory Transistors" by S. Saito, N. Endo, Y. Uchida, T. Tanaka, Y. Nishi and K. Tamaru, Proceedings of the 7th Conference on Solid State Devices, Tokyo, 1975, pp. 185-190. The memory in the paper employs non-volatile memory cells as shown in FIG. 1. In the figure, transistors T1 T2, T7 and T8 are P-channel enhancement type MOS transistors; transistors T3 and T4, P-channel depletion type MOS transistors; transistorsMT1 and MT2, metal nitride oxide semiconductor (MNOS) transistors of the P-channel variable threshold type.

In the MNOS transistor, the gate insulating layer is formed by double layers; a nitride layer (Si3N4) and a very thin oxide layer (SiO2). The charge transfer is made between a trap level existing in the vicinity of the interface between the nitride and oxide layers, and the substrate, through the tunnel phenomena in the extremely thin oxide layer, and the levels of the gate threshold voltage of the transistor are made to correspond to the binary information "1" and "0". The information are stored in a non-volatile manner.

The transistors T7 and T8 serve each as a switching transistor. When these transistors are turned on, the circuit operates as a single-channel, MOS type circuit at the time that a power source is in a stable state. When the power source is in a transient state, information transfer is performed between the single-channel, MOS type circuit and the MNOS transistors MT1 and MT2. In this way, the above-mentioned circuit serves as a memory cell of the non-volatile read write random access memory type.

The memory circuit, however, has mainly the following two grave defects. One is a large power consumption of each memory. In the memory cell of the single channel type, DC current flows into at least one of the load transistors T3 and T4 in a stable operation mode. Further, in order to prohibit the write-operation into the MNOS transistor, the power source voltage $|V_{DD}-V_{SS}|$ (where $V_{DD}$ is a power source voltage and $V_{SS}$ is a ground voltage) must be large. For this, the power consumption per memory cell takes a great value in the order of several hundreds microwatt. Another defect is that a large value, for example, $-20$ V, is necessary for the power source voltage $(V_{DD}-V_{SS})$.

The necessity of such a large power source voltage is undesirable when the integration density the reliability, and the like are taken into consideration. In the light of this, the development of the memory circuit operable by a lower power source has long been desired.

SUMMARY OF THE INVENTION

Accordingly, an object of the invention is to provide a memory circuit with a small power consumption and with a non-volatile memory function.

Another object of the invention is to provide a memory circuit with a low power source voltage and with a non-volatile memory function.

To achieve the above objects, there is provided a memory circuit having non-volatile memory cells each with a bistable circuit including a couple of series circuits each connected in such a way that first and second insulated gate transistors of the first channel type and a third insulated gate transistor of the second channel type are connected in series fashion, a common connection part is provided commonly connecting the gates of the first and third insulated gate transistors, a control signal is applied to the gate of the second insulated gate transistor, through a control signal line and an output part is provided which is a connection part connecting the first or third insulating gate transistor and the second insulated gate transistor, the connection part of one of the series circuit being connected to the output part of the other series circuit while the output part of the former, to the connection part of the latter, wherein a non-volatile memory element is connected to the connection part of said first and second insulated gate transistors of one of said series circuits.

Other objects and features of the invention will be apparent from the following description taken in connection with the accompanying drawings, in which:

DETAIL DESCRIPTION OF THE PREFERRED EMBODIMENTS

Figure 2:
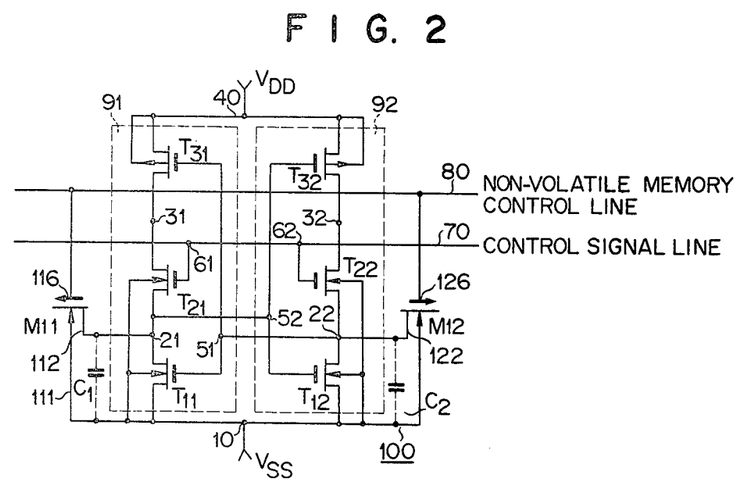
FIG. 2 shows a circuit diagram of a non-volatile memory cell used in a memory circuit according to the invention.

Reference is first made to FIG. 2 illustrating a non-volatile memory cell which is an embodiment according to the invention. As shown, first and second N-channel, enhancement type MOS transistors T11 and T21, and a P-channel, enhancement type MOS transistor T31 are serially connected in this order. The first MOS transistor T11 and the MOS type transistor T31 are commonly connected at the gates, and the common connection between them leads to an input terminal 51. The gate of the second MOS transistor T21 leads to a control terminal 61. An output terminal 21 is continuous to the connection line connecting the drain of the first MOS transistor T11 to the source of the second MOS transistor T21. With such a connection, a first inverter circuit 91 is formed having the input and the output terminals 51 and 21, and the control terminal 61.

A second inverter circuit 92 with a similar circuit construction is provided in the memory cell, being formed as in the following manner. First and second N-channel, enhancement type MOS transistors T12 and T22, and a P-channel, enhancement type MOS transistor T32 are serially connected in this order. The first and second MOS transistors T12 and T32 are commonly connected at the gates and the common connection between them leads to an input terminal 52. The gate of the second MOS transistor T32 leads to a control terminal 62. An output terminal 22 is continuous to the connection line connecting to the first N-channel, enhancement type MOS transistor T12 and the second N-channel, enhancement type MOS transistor T22. With such a connection, the second inverter circuit 92 is formed having the input and the output terminals 52 and 22, and the control terminal 62.

The first and second inverter circuits 91 and 92 thus constructed cooperatively form a flip-flop circuit by connecting them in such a manner that the input terminal of one of the inverter circuits is connected to the output terminal of the other inverter circuit and the output terminal of the former is connected to the input terminal of the latter. More specifically, the input terminal 51 of the inverter 91 is connected to the output terminal 22 of the inverter circuit 92 while the input terminal 52 of the inverter circuit 92 is connected to the output terminal 21 of the inverter circuit 91. The control terminal 61 and 62 of the inverter circuits 91 and 92 are connected to a common control signal line 70. The sources of the P-channel transistors T31 and T32 are connected to a power source terminal 40 and are supplied with a power having a voltage $V_{DD}$. The sources of the N-channel transistors T11 and T12 are commonly connected to a reference potential terminal 10 from which a reference voltage $V_{ss}$ is applied to the terminal 10. The output terminals 21 and 22 of the bistable circuit comprised of the CMOS circuit are connected with the non-volatile memory elements M11 and M12. In this example, the threshold voltage of the N-channel transistors T11, T12, T21 and T22 is +1 V and that of each of the P-channel transistors T31 and T32 is −2 V.

Figure 3:
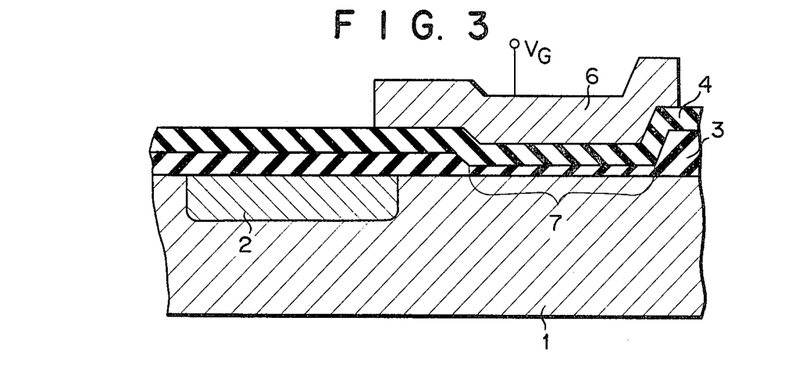
FIG. 3 shows a partial cross sectional view of an MNOS switching capacitive element as an example of a non-volatile memory element.

Turning now to FIG. 3, there is shown in a cross sectional form a structure of each of the non-volatile memory elements M11 and M12. As shown, a source region 2 of a first conductivity (P-type) semiconductor substrate 1 on the surface area is provided with a source region 2 of the opposite conductivity type. An oxide silicon layer 3 is formed on the substrate 1, and the source area 2 buried in the surface area of the substrate 1. The oxide silicon layer 3 is thick (for example, 100 to 1000 Å) on and near the source region 2 and is thin (for example, 20 Å) in the memory region 7 so as to admit electrons or positive holes to pass through the thin layer 3. Formed on the oxide silicon layer 3 is a nitride silicon layer 4 with a thickness of 500 Å, for example. A conductive gate electrode 6 is partially layered on the nitride silicon layer 4, extending over a part of the source region 2 and covering the entire memory region 7. The electrode 6 is made of aluminum, for example.

The memory element with the source region 2 of N type will be called an N-channel, MNOS type switching capacity element while the memory element with that of P type will be called a P-channel, MNOS switching capacity element.

Figure 4:
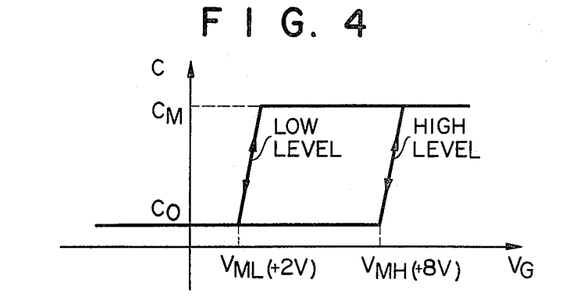
FIG. 4 shows a characteristic curve illustrating a relation between capacity and voltage of an MNOS type switching capacitive element shown in FIG. 3.

In FIG. 4 which will be described, a graph is depicted illustrating the relationship between a capacitance C between the N-channel MNOS type switching capacitive element and the gate electrode 6, and a voltage $V_G$ at the gate electrode 6 measured with respect to the source region 2 as a reference. Because of the MNOS structure, the switching voltage is variable and varies in such a manner that, in a high level state, it is at $V_{MH}$, for example, +8 V, and, in a low level state, the switching voltage is at $V_{ML}$, for example, −2 V. In a region where the gate voltage $V_G$ is larger than the switching voltage, no channel is formed in the memory portion 7, so that the capacitance C takes a small value $C_M$, while in the region where it is smaller than the switching voltage, a channel is formed so that the capacitance C takes a small value CO.

Figure 5:
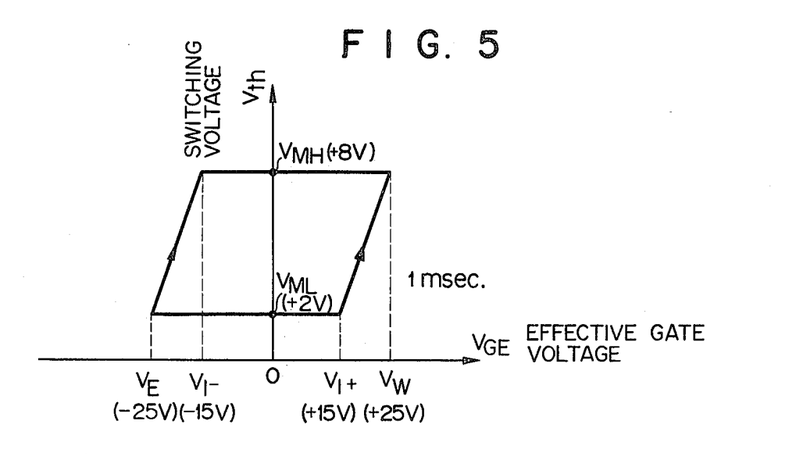
FIG. 5 shows a curve depicting a hysteresis characteristic of the MNOS type switching capacitive element shown in FIG. 3.

Another graph shown in FIG. 5 illustrates a hysteresis characteristic existing between the switching voltage Vth and the gate voltage $V_{GE}$. In the graph, the effective gate voltage $V_{GE}$ is the potential at the gate electrode 6 measured with respect to the potential at the source region 2, when the potential at the gate electrode 6 is higher than the potential at the P type semiconductor substrate 1. The voltage $V_{GE}$ is the potential at the gate electrode 6 measured with respect to the potential at the P type semiconductor substrate 1 when the gate 6 potential is lower than the potential at the P type semiconductor substrate 1.

As shown in FIG. 5, a pulse of +25 V, for example, for $V_W$ and 1 ms for the pulse width is applied as the effective gate voltage $V_{GE}$ to the N-channel MNOS type switching capacity element, and the switching voltage Vth moves in a positive direction to reach $V_{MH}$ (+8 V). The voltage $V_{MH}$ is maintained even after the voltage pulse terminates.

Inversely, when the effective gate voltage $V_{GE}$ applied is a pulse −25 V, for example, for $V_E$ and 1 ms for the pulse width, the switching voltage Vth of the N-channel MNOS type switching capacity element moves in a negative direction to reach $V_{ML}$ (+2 V). The $V_{ML}$ is maintained after the voltage pulse terminates. Thus, the value of the switching voltage is kept so long as the effective gate voltage exceeding VI+(+15 V) or VI−(−15 V) is not applied to the gate electrode 6.

In the embodiment shown in FIG. 2, the output terminal 21 of the bistable circuit of the CMOS circuit is connected to the source region 112 of the MNOS type switching capacity element M11. The output terminal 22 is connected to the source region 122 of the MNOS type switching capacity element M12. The gate electrodes 116 and 126 of the N-channel MNOS type switching capacity elements M11 and M12 are commonly connected to the non-volatile memory control line 80.

The capacitors C1 and C2 connected to the output terminals 21 and 22 are capacitances of the terminals 21 and 22 and generally employ stray capacitance elements.

Figure 6:
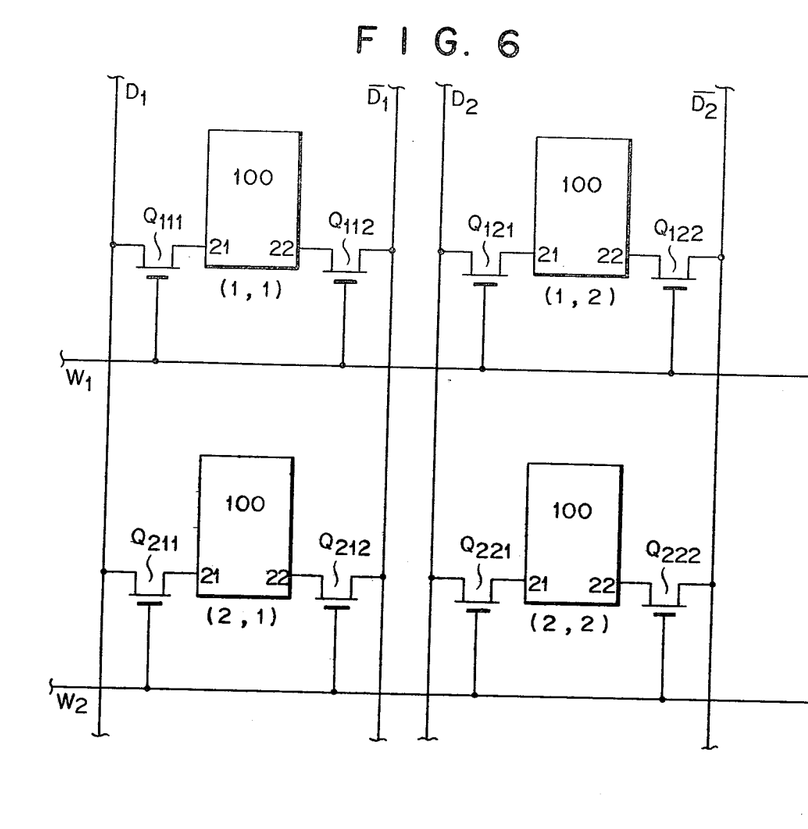
FIG. 6 shows an array of non-volatile memory cell as an embodiment of the memory circuit according to the invention.

Turning now to FIG. 6, there is shown a memory cell array using memory cells 100 each shown in FIG. 2. As shown, the output terminals 21 and 22 of a memory cell (i, j) at the cross-point of the ith row and the jth column are connected to digit lines Dj and $\overline{Dj}$ arranged in a pair in the column direction, through the select transistors QiJ1 and Qij2. The select transistors QiJ1 and Qij2 are connected at the gates to a word line Wi disposed for each row. The select transistors Qij1 and Qij2 may be of N-channel or P-channel type. In this example, the N-channel transistor is preferable and therefore the N-channel transistors are used. In the case of the N-channel transistor, the movility of an electron is larger than that of a positive hole. Accordingly, a memory constructed by using the N-channel transistors is operable at a high speed three to four times as high as a memory using the P-channel transistors. Accordingly, the N-channel transistors are preferable and therefore are used in this embodiment.

The operation of the non-volatile memory cell 100 shown in FIG. 2 will be described when it is assembled into the memory cell array shown in FIG. 6. To illustrate the operation, assume that the power source voltage $V_{DD}$ is +5 V. When a HIGH level voltage (+5 V) is applied to the control signal line 70, the N-channel transistors T21 and T22 are conductive. Accordingly, the circuit shown in FIG. 2 operates as a CMOS flip-flop circuit in much the same manner as an ordinary CMOS memory cell operates. As a result, one of the output terminals 21 and 22 is at $V_{DD}$ (+5 V) and the other is at Vss (0 V). Assume that the substrates of the N-channel devices in the memory cells are all biased to Vss level (0 V) while the substrates of the P-channel devices are all biased to $V_{DD}$ (5 V). A negative voltage pulse $V_E$(−25 V) of 1 ms pulse width is applied to the gate electrodes 116 and 126 of the memory elements M11 and M12, through the non-volatile memory control line 80. Upon receipt of the pulse, the memory elements M11 and M12 are both in a LOW level state. The operation in which the non-volatile memory elements M11 and M12 are both caused to be in a LOW level state by applying the $V_E$ (−25 V), is called an erasing operation in this specification.

As a program operation (write-in operation), a positive voltage pulse $V_W$ (amplitude, +25 V) with 1 ms pulse width is applied to the gate electrodes 116 and 126 of the MNOS non-volatile memory elements M11 and M12. As a result, a state of the switching voltage of each MNOS non-volatile memory elements changes depending on the contents of information, "0" or "1", in the non-volatile memory cell 100. In this embodiment, it is assumed that, when the output terminal 21 is at $V_{DD}$ and the another output terminal 22 is at Vss, information stored in the memory cell 100 is represented "1", and that, in an inverse state of each output terminal, the information is represented by "0".

When "1" is program-operated (written), the voltage states of the switching voltages of the non-volatile memory elements M11 and M12 become (M11, M12)=($V_{ML}$, $V_{MH}$), through the following process. When the memory cell has "1", the potential at the output terminal 22 is Vss (0 V). The potential at the output terminal 21 has been $V_{DD}$, for example, 4 V, from the first. At this time, if the program operation applies Vw to the MNOS switching capacitive elements M11 and M12, the capacitance is divided by the element M11 and the stray capacitor C1 and therefore the source potential Vs of the element M11 is given $$V_s = 4V + \frac{CM}{C1 + CM}(V_w - V_{ML})$$

In the equation, if CM=C1, Vw=+25 V and $V_{ML}$=+2 V, Vs=+15.5 V, and the effective gate voltage $V_{GE}$ is expressed by $V_{GE}$=Vw−Vs=9.5 V. The $V_{GE}$ is much smaller than $V_{I+}$(+15 V). Accordingly, as seen from the hysteresis characteristic shown in FIG. 5, no change of the voltage takes place, so that the voltage is maintained at $V_{ML}$. On the other hand, the source potential Vs of the switching capacitive element M12 is sustained at 0 V since the transistor T12 is conductive. At this time, the effective voltage $V_{GE}$=Vw−Vs=25 V, so that the switching voltage of the switching capacitive element M12 shifts from $V_{ML}$ to $V_{MH}$ in accordance with the hysteresis characteristic shown in FIG. 5. In this way, the switching voltage values of the non-volatile memory elements M11 and M12, after the program operation, become $V_{ML}$ and $V_{MH}$, respectively.

When information "0" is subjected to the program operation (write-in opertion), the following relation holds: (M11, M12)=($V_{MH}$, $V_{ML}$). The reason for this follows. When the information is "0", the potential at the output terminal 21 is Vss (0 V) and the potential at the output terminal 21 is originally at $V_{DD}$, for example, 4 V. At the initial stage, the non-volatile memory element is in an erased state and therefore (M11, M12)=($V_{ML}$, $V_{ML}$). At this time, if the program operation applies Vw to the switching capacitive elements M11 and M12, the capacitance is divided by the element M12 and the stray capacitance C2 and therefore the source potential Vs of the element M12 is given $$V_s = 4V + \frac{CM}{C2 + CM}(V_w - V_{ML})$$

If CM=C1, Vw=+25, and $V_{ML}$=+2 V, Vs=+15.5 V and the effective gate voltage $V_{GE}$=Vw−Vs=9.5 V. The value of the $V_{GE}$ is smaller than $V_{I+}$(15 V), so that the switching voltage becomes $V_{ML}$, i.e., remains unchanged.

The source potential of the switching capacitive element M11 is given by Vs=0 V since the transistor T11 is conductive. Therefore, the effective gate voltage is given by $V_{GE}$=Vw−Vs=25 V. The hysteresis characteristic shown in FIG. 5 accordingly causes the switching voltage to change from $V_{ML}$ to $V_{MH}$. As a result, the switching voltage values of the non-volatile memory elements M11 and M12, after the program operation, become $V_{MH}$ and $V_{ML}$, respectively.

In this manner, the circuit information of the nonvolatile memory cell 100 are stored in the MNOS switching capacitive elements M11 and M12, through the erasing operation and the program operation.

The information stored in the MNOS switching capacitive elements M11 and M12 may be restored as the circuit information of the memory cell 100 in the following manner, for example.

The potential of the control signal line 70 is assumed to be Vss. Upon receipt of the potential Vss, the n-channel transistors T21 and T22 are rendered nonconductive. At this time, the potential at the output terminal 21 and 22 are previously initialized to be Vss (0 V). The initialization may be made by dropping the power source voltage $V_{DD}$ to the Vss. Alternately, this may be realized in a manner that, in a condition that the power source $V_{DD}$ is turned on, the potentials at the digit lines Dj and $\overline{Dj}$ are previously set to the Vss through the select transistors Qij1 and Qij2 in the memory cell array as shown in FIG. 6. Then, in restoring the information of the MNOS capacitive elements M11 and M12, all the select transistors are rendered nonconductive. Through the non-volatile memory control line 80, a restore signal with the amplitude $V_R$ is applied to the non-volatile memory element M11 and M12. If the potentials at the output terminals 21 and 22 after the restore signal pulse with the amplitude $V_R$, e.g., + 5 V, rises are denoted as V21 and V22, these potentials are given $$V21 = \frac{CM}{CM + C1} (V_R - V_{ML})$$

$$V22 \cong 0V$$

The above relations are based on the capacitance sharing mechanism. Here, when $C_0 \cong 0 << CM$, $CM = C1$, $V_R = 5$ V, and $V_{ML} = 2$ V, V21=1.5 V, and V22=0 V Then, with the potential $V_{DD}$ (+5 V) of the control signal line 70, the potential relation between the potentials at the output terminals 21 and 22 are kept as it is and the information "1" is restored. After this, if the restoring signal pulses falls off, the information restored is not volatilized, since the n-channel transistors T21 and T22 have been conductive.

When (M11, M12) = ($M_{MH}$, $V_{ML}$), the circuit information "0" is restored in a quite similar manner. At this time, note that the voltage restored is much the same as the information at the time of the program operation.

Succeedingly, the non-volatile memory cell 100 can serve as a CMOS flip-flop and continue the memory operation with low power consumption, with the initial value of the state when the circuit state of the non-volatile memory elements are restored.

The non-volatile cell 100 operates in the CMOS circuit operation, so that little power is consumed at the time of stand-by. In other words, the power consumption of the memory cell in the static mode arises only from a junction leak current. Further, the memory cell permits the information to be transferred between the non-volatile memory elements and the bistable circuit. When there is no need for the read or write of the circuit information for a long period, the power source related may be turned off if the circuit information are stored in the non-volatile memory elements through the erasing and the program operations. At this time, it is possible to perfectly zero the power consumption. Therefore, the memory circuit according to the invention is essentially of a power saving type. Moreover, in the memory circuit, by taking advantage of the feature of the CMOS circuit, all the transistors T11, T12, T21, T22, T31 and T32 may be minimized in size. Thus, the size of the non-volatile memory cell may be made small in size.

As mentioned above, the memory circuit has the n-channel transistors T21 and T22 receiving the control signal in the memory cell. Because of the use of the transistors, the program inhibiting voltage necessary for the program operation may be formed at the terminal 21 or 22 by capacitance-dividing the program voltage pulse Vw applied to the gates of the elements M11 and M12, as mentioned above.

The voltage produced at the terminals 21 or 22 is isolated by the n-channel transistors T21 or T22, so that it is not applied to the drain of the p-channel transistor T31 or T32. Therefore, the parasitic phenomenon such as a latch-up phenomenon between the n-channel transistor T21 or T22 and the p-channel transistor T31 or T32 may be prevented. Therefore, the power source voltage $V_{DD}$ may be set at low voltage, for example, 5 V or less, irrespective of the program inhibit voltage for the non-volatile memory element M11 to M12.

Figure 7:
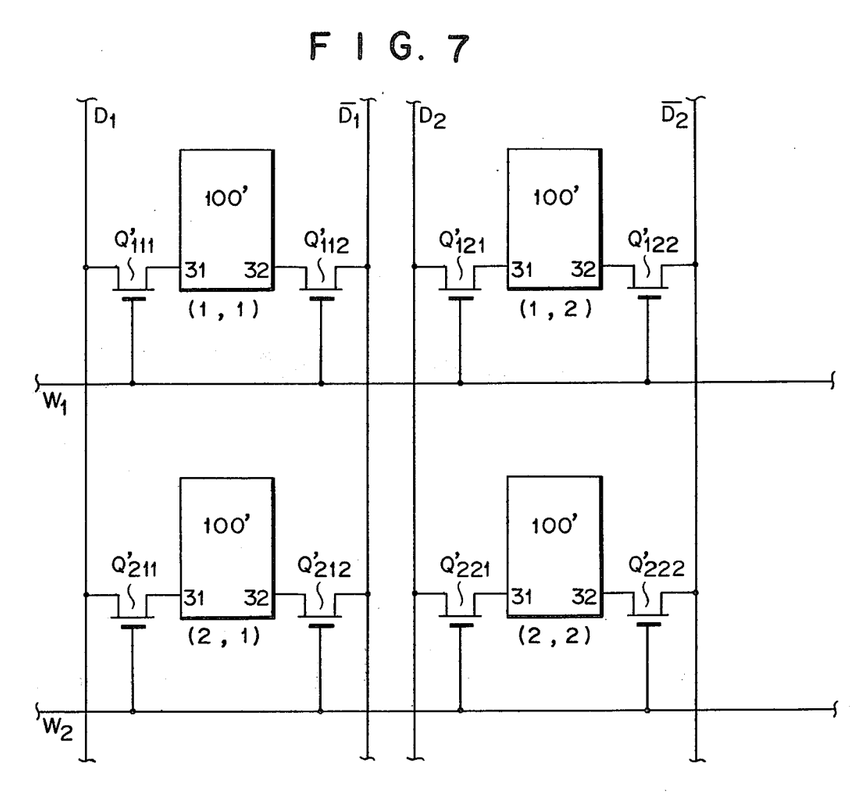
FIG. 7 shows a non-volatile memory cell array which is another embodiment according to the invention.

Turning now to FIG. 7, there is shown another embodiment of the memory cell array according to the invention. Only the difference of the embodiment from the memory cell array shown in FIG. 6 is that the connection points 31 and 32 between the n-channel transistors T21 and T22 and the p-channel transistors T31 and T32 are connected to the digit lines Dj and $\overline{Dj}$, through the select transistors $Q'_{ij1}$ and $Q'_{ij2}$. The remaining construction and the operation of the embodiment shown in FIG. 7 are the same as those of that shown in FIG. 6.

Figure 8:
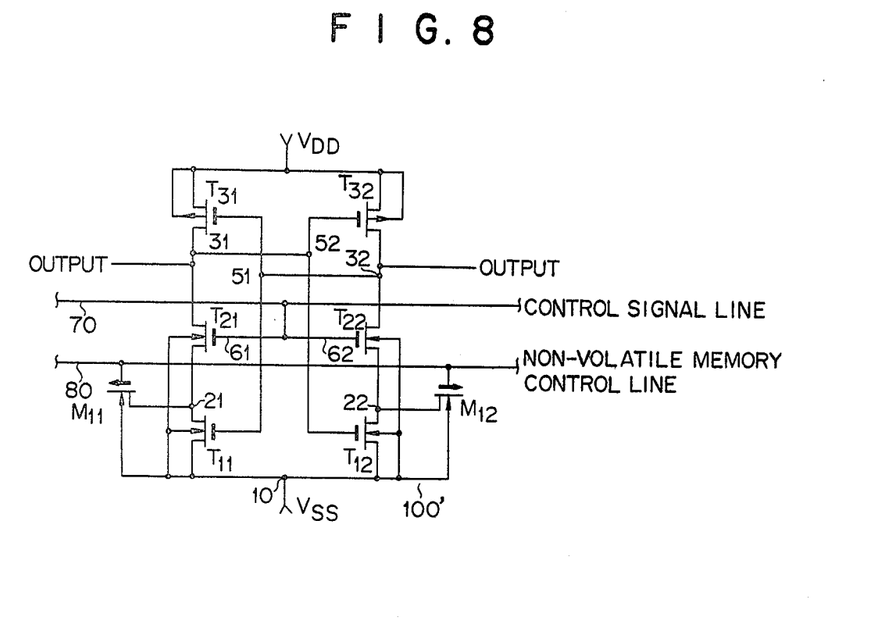
FIG. 8 shows a circuit diagram of a non-volatile memory cell used in the memory circuit according to the invention.

FIG. 8 shows another embodiment of the non-volatile memory cell according to the invention. As shown, the connecting point 31 between the first n-channel transistor T21 and the p-channel transistor T31 and the connecting point 32 between the second n-channel transistor T22 and the p-channel transistor T32 are used as the output terminals. The output terminals 31 and the input terminal 52 are connected to each other. Similarly, the output terminal 32 is connected to the input terminal 51. In the circuit, the restoration is performed by applying a given potential to the power source $V_{DD}$ and the control signal line 70 after the restoration signal pulse $V_R$ is applied to the non-volatile control signal line 80. The erasing operation and the program operation may be performed in a quite similar operation of the memory cell 100 shown in FIG. 2. The memory cell 100' in FIG. 8 may be adapted to the memory cell in the memory cell array shown in FIG. 6 or FIG. 7.

In the embodiments heretofore described, a pair of non-volatile memory elements M11 and M12 are connected to the terminals 21 and 22, respectively. However, the two memory elements are not necessarily used. One of the memory elements M11 and M12 may be replaced by a capacitance element. Specifically, if a capacitance is used for such a capacitance element, it is sufficient that the non-volatile memory element M11 or M12 is connected to the terminal 21 or 22. The reason for this is that the restoration operation may be performed on the basis of the relative amplitude of a voltage induced by the capacitive element and a voltage by the non-volatile memory element, and that the erasing and the program operations may also be performed against the non-volatile memory element in a quite similar manner.

Although the MNOS type switching capacitive element is used for the non-volatile memory element, a capacitive element with a variable threshold value may be used in place of the switching capacitive element. MAOS type elements, floating gate elements and the like are usable for such capacitive elements. Further, p-channel devices may be used for the transistors T11, T12, T21, T22, Ml1 and M12 and similarly N-channel devices for the transistors T31 and T32. In this case, the porality of the voltage used is opposite to that of the voltage in the above-mentioned embodiments.

What is claimed is:

1. A memory circuit having non-volatile memory cells each with a bistable circuit including a couple of series each connected in such a way that first and second insulated gates transistors of the first channel type and a third gate transistor of the second channel type are connected in series fashion, a common connection part is provided commonly connecting the gates of the first and third insulated gate transistors, a control signal is applied to the gate of the second insulated gate transistor through a control signal line, separate from said common part, and an output part is provided which is a connection part connecting the first or third insulating gate transistor and the second insulated gate transistor, the connection part of one of the series circuit being connected to the output part of the other series circuit while the output part of the former, to the connection part of the latter, wherein a non-volatile memory element is connected to the connection part of said first and second insulated gate transistors of one of said series circuits.

2. A memory circuit according to claim 1, in which said non-volatile memory element is a MNOS type device.

3. A memory circuit according to claim 1, in which said non-volatile memory element is a MAOS type device.

4. A memory circuit according to claim 1, in which said non-volatile memory element is a floating gate type device.

5. A memory circuit according to claim 1, in which said first channel is a N-channel and said second channel is a P-channel.

6. A memory circuit according to claim 1, in which said first channel is a P-type channel and said second channel is a N-type channel.

7. A memory circuit according to claim 1, wherein the gate electrode of said non-volatile memory element is connected to a non-volatile memory control signal line, separate from said common concentration part and said control signal line.

8. A memory circuit according to claim 1, wherein the voltage applied to said series circuits is less than the voltage applied to the non-volatile memory element.

9. A memory circuit comprising:
a memory array having unit memory cells arranged in a matrix fashion, said each unit memory cell having a bistable circuit including a couple of series circuits each memory cells each having a bistable circuit including a couple of series circuits each connected in such a way that first and second insulated gate transistors of the first channel type and a third insulated gate transistor of the second channel type are connected in series fashion, a common connection part is provided commonly connecting the gates of the first and third insulated gate transistors, a control signal is applied to the gate of the second insulated gate transistor through a control signal line separate from said common connection part, and an output part is provided which is a connection part connecting the first or third insulating gate transistor and the second insulated gate transistor, the connection part of one of the series circuit being connected to the output part of the other series circuit while the output part of the former, to the connection part of the latter, a non-volatile memory element connected to the connection part of the first and second insulated gate transistors of one of the series circuits, and first and second select transistors respectively connected to a pair of connection parts each connecting the first or third insulated gate transistor and the second insulated gate transistor;
pairs of digit lines each pair of which is connected commonly to the other ends of said first and second select transistors of the unit memory cells arranged in a column direction of the memory array; and
word lines connected commonly to the gates of the first and second select transistors of unit memory cells arranged in a row direction of the memory array.

10. A memory circuit according to claim 9, in which said non-volatile memory element is a MNOS type device.

11. A memory circuit according to claim 9, in which said non-volatile memory element is a MAOS type device.

12. A memory array according to claim 9, in which said non-volatile memory element is a floating gate type device.

13. A memory circuit according to claim 9, in which said first channel is of N-type and said second channel is of P-type.

14. A memory circuit according to claim 9, in which said first channel is of P-type and said second channel is of N-type.

15. A memory circuit according to claim 9, wherein the gate electrode of said non-volatile memory element is connected to a non-volatile memory control signal line, separate from said common connection part and said control signal line.

16. A memory circuit according to claim 9, wherein the voltage applied to said series circuits is less than the voltage applied to the non-volatile memory element.

17. A memory circuit having a power source, a bistable circuit connected to the power source, a non-volatile memory element connected to the bistable circuit, a control signal line for supplying a control signal to the bistable circuit, and a non-volatile memory control line for supplying a control signal to the non-volatile memory element, in which said bistable circuit comprising: a pair of first insulated gate transistors having first, second and third terminals; a pair of second insulated gate transistors of the same channel type as that of said first insulated gate transistor, of which the first terminals are connected in series to the second terminals of the first insulated gate transistors and the third terminals are connected to said control signal line: a pair of third insulated gate transistors of the channel type different from that of said first and second insulated gate transistors, of which the second terminals are connected to the second terminals of said second transistors and the first terminals are connected to said power source, wherein said control signal line is separate from the connection of the first terminal of the second insulated gate transistor with the second terminal of the first insulated gate transistor, and wherein a first connection point between said first insulated gate transistor and said second insulated gate transistor in one of said series circuits is connected to a connecting point between the gate of said first insulated gate transistor and the gate of said third insulated gate transistor in the other series circuit, the first terminal of at least one non-volatile memory element is connected to said first connection point.

18. A memory circuit according to claim 17, in which said first channel is a N-channel and said second channel is a P-channel.

19. A memory circuit according to claim 18, in which said first, said second and said third terminals are a source, a drain and a gate, respectively.

20. A memory circuit according to claim 17, in which said first channel is of the P-type, and said second channel is of the N-type.

21. A memory circuit according to claim 20, in which said first, said second, and said third terminals are a drain, a source and a gate, respectively.

22. A memory circuit according to claim 17, in which said non-volatile memory element is a MNOS type device.

23. A memory circuit according to claim 17, in which said non-volatile memory element is a MAOS type device.

24. A memory circuit according to claim 17, in which said non-volatile memory element is a floating gate type device.

25. A memory circuit according to claim 17, wherein the gate electrode of said non-volatile memory element is connected to said non-volatile memory control line, separate from said control signal line.

26. A memory circuit according to claim 17, wherein the voltage applied to said series circuits is less than the voltage applied to the non-volatile memory element.

* * * * *